United States Patent
Kumagai et al.

(10) Patent No.: US 10,731,274 B2
(45) Date of Patent: Aug. 4, 2020

(54) GROUP III NITRIDE LAMINATE AND VERTICAL SEMICONDUCTOR DEVICE HAVING THE LAMINATE

(71) Applicant: STANLEY ELECTRIC CO., LTD., Meguro-ku, Tokyo (JP)

(72) Inventors: Yoshinao Kumagai, Tokyo (JP); Hisashi Murakami, Tokyo (JP); Toru Kinoshita, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/312,885

(22) PCT Filed: Jun. 19, 2017

(86) PCT No.: PCT/JP2017/022454
§ 371 (c)(1),
(2) Date: Dec. 21, 2018

(87) PCT Pub. No.: WO2017/221863
PCT Pub. Date: Dec. 28, 2017

(65) Prior Publication Data
US 2019/0323146 A1    Oct. 24, 2019

(30) Foreign Application Priority Data

Jun. 24, 2016   (JP) .................. 2016-125477

(51) Int. Cl.
*H01L 33/00*   (2010.01)
*H01L 33/32*   (2010.01)
*C30B 29/40*   (2006.01)

(52) U.S. Cl.
CPC ........ *C30B 29/406* (2013.01); *H01L 33/0075* (2013.01); *H01L 33/325* (2013.01); *H01L 2933/0016* (2013.01)

(58) Field of Classification Search
None
See application file for complete search history.

(56) References Cited

U.S. PATENT DOCUMENTS

2004/0113156 A1    6/2004   Tamura et al.
2006/0223287 A1*  10/2006   Ushida ................ C30B 25/02
                                                    438/483

(Continued)

FOREIGN PATENT DOCUMENTS

JP    2004179365 A    6/2004
JP    2006261358 A    9/2006

(Continued)

OTHER PUBLICATIONS

Machine-generated English translation of JP 2016082200A, total pp. 22. (Year: 2016).*

(Continued)

*Primary Examiner* — Bo B Jang
(74) *Attorney, Agent, or Firm* — Holtz, Holtz & Volek PC

(57) ABSTRACT

A group III nitride laminate having monocrystalline n-type $Al_xGa_{1-x}N$ ($0.7 \leq X \leq 1.0$) and an electrode is provided. The group III nitride laminate is characterized in that an n-type contact layer made of $(Al_yGa_{1-y})_2O_3$ ($0.0 \leq Y < 0.3$) is provided between the monocrystalline n-type $Al_xGa_{1-x}N$ ($0.7 \leq X \leq 1.0$) and the electrode. Furthermore, a vertical semiconductor device including the above-described group III nitride laminate is provided.

5 Claims, 1 Drawing Sheet

(56) References Cited

U.S. PATENT DOCUMENTS

| | | |
|---|---|---|
| 2010/0270548 A1 | 10/2010 | Ikemoto et al. |
| 2010/0320462 A1 | 12/2010 | Koukitu et al. |
| 2011/0018104 A1 | 1/2011 | Nagashima et al. |
| 2011/0266553 A1 | 11/2011 | Ohta et al. |
| 2012/0258591 A1 | 10/2012 | Tamari et al. |
| 2014/0048823 A1 | 2/2014 | Sato et al. |

FOREIGN PATENT DOCUMENTS

| | | | |
|---|---|---|---|
| JP | 2007234902 A | | 9/2007 |
| JP | 2010239064 A | * | 10/2010 |
| JP | 2011061086 A | * | 3/2011 |
| JP | 2011082570 A | | 4/2011 |
| JP | 5352248 B2 | | 11/2013 |
| JP | 5594530 B2 | | 9/2014 |
| JP | 5670349 B2 | | 2/2015 |
| JP | 2016082200 A | | 5/2016 |
| JP | 2017157725 A | * | 9/2017 |
| WO | 2008096884 A1 | | 8/2008 |
| WO | 2009090821 A1 | | 7/2009 |
| WO | 2012137781 A1 | | 10/2012 |

OTHER PUBLICATIONS

International Search Report (ISR) dated Aug. 1, 2017 issued in International Application No. PCT/JP2017/022454.
Kazushiro Nomura, et al., "Thermodynamic study of B—Ga2O3 growth by halide vapor phase epitaxy," Journal of Crystal Growth, 2014, vol. 405, pp. 19-22.
Written Opinion dated Aug. 1, 2017 issued in International Application No. PCT/JP2017/022454.

* cited by examiner

GROUP III NITRIDE LAMINATE AND VERTICAL SEMICONDUCTOR DEVICE HAVING THE LAMINATE

TECHNICAL FIELD

The present invention relates to a group III nitride laminated structure that can be applied to semiconductor devices, such as light-emitting diodes, and a laminated structure that is made of a group III nitride having an n-type contact layer between an elect rode and an n-type group III nitride layer, and a vertical send conductor device having the laminated structure.

BACKGROUND ART

An $Al_xGa_{1-x}N$ group XIX nitride semiconductor, having a high Al composition has higher band gap energy than GaN or SiC, which is generally known as a wide band gap semiconductor, and therefore is expected to be applied to various types of semiconductor devices, such as deep ultraviolet light-emitting elements and electronic devices having higher withstand voltage characteristics than ever before.

In producing such a semiconductor device, a technique rot obtaining favorable ohmic characteristics, by reducing a contact resistance between an $Al_xGa_{1-x}N$ semiconductor layer having a high Al composition and an electrode, becomes very important from the viewpoint of reducing a power loss in the device and joule heat produced owing to the power loss. However, since an increase in the Al composition makes it difficult to obtain the favorable ohmic characteristics, a lot of studies have been performed on art electrode material, a formation method thereof, and the structure of a contact layer having an n-type $Al_xGa_{1-x}N$ semiconductor layer, as a method for forming an ohmic electrode on the n-type $Al_xGa_{1-x}N$ semiconductor layer having a high Al composition. For example, Patent Literature 1 proposes a method in which a first, electrode metal made of Ti, V, and Ta is formed on an n-type AlGaN layer and then a heat treatment is applied thereto at a predetermined temperature. Furthermore, a second electrode metal including a high conductive metal is formed on the first electrode metal. As other methods. Patent Literatures 2 and 3 propose structures to reduce a contact resistance by forming an n-type AlGaN layer, having a low Al composition as a contact layer on a surface on which electrodes are to be formed.

CITATION LIST

Patent Literature

Patent Literature 1: Japanese Patent No. 5670349
Patent Literature 2: Japanese Patent No. 5352246
Patent Literature 3: Japanese Patent No. 5594530

SUMMARY OF INVENTION

Technical Problem

However, when electrodes are formed by the method disclosed in Patent Literature 1, if the Al composition of n-type $Al_xGa_{1-x}N$ is 0.7 or more, in particular, if ohmic electrodes are formed on n-type AlN having an Al composition of 1.0, the n-type conductivity of a semiconductor layer is significantly reduced, and furthermore a damage layer, such as an oxidation layer formed on a surface of the n-type $Al_xGa_{1-x}N$, is easily formed. As a result, there is a problem that the resistance between the electrode and the n-type $Al_xGa_{1-x}N$ become a large as compared with the case of having an Al composition of the order of 0.5, and thus may cause formation of a Schottky barrier.

To adopt too structures disclosed in Patent Literatures 2 and 3, electrodes are required to be formed by the following method. Namely, after a mask material is first formed on a semiconductor layer, openings are formed by photolithography at portions in which electrodes are to be formed. Next, crystals of a contact layer made of an n-type AlGaN layer selectively grow in the openings, and thereafter the mask material is removed. At last, the electrodes are formed on the contact layer. In this case, since the n-type AlGaN layer that is directly in contact with the electrodes can have a low Al composition, favorable electrode characteristics can be obtained. However, there is problem that, as described above, the electrode forming process becomes very complicated as compared with a general electrode forming process. In the case of application to an ultraviolet light-emitting diode, since the contact layer has a low Al composition, ultraviolet rays emitted from a light-emit ting layer are absorbed by the contact layer. As a result, there is also a problem of a characteristic deterioration, such as a reduction in luminescence efficiency.

Accordingly, the present invention has been achieved in consideration of such objects, and the present invention aims at providing a group III nitride laminate having favorable electrode characteristics that has reduced contact resistance between n-type $Al_xGa_{1-x}N$ having a high hi composition and an electrode.

Solution to Problem

The inventors have intensively studied to solve the above-described problems. The inventors have conceived of a structure in which a contact layer that is made of wide band gap material having favorable ultraviolet light transparency and a semiconductor material having high conductivity characteristics is provided between n-type $Al_xGa_{1-x}N$ ($0.7 \leq X \leq 1.0$) having a high Al composition and an electrode. The inventors have round out that, when a laminated structure having a $Ga_2O_3$ layer material, which is conventionally used as a substrate material, as the contact layer is produced, a Schottky barrier between electrodes is reduced and favorable contact characteristics are obtained, and have reached completion of the present invention.

Namely, a first aspect of the present invention is a group III nitride laminate having monocrystalline n-type $Al_xGa_{1-x}N$ ($0.7 \leq X \leq 1.0$) and an electrode. The group III nitride laminate is characterised in that an n-type contact layer made of $(Al_YGa_{1-Y})_2O_3$ ($0.0 \leq Y < 0.3$) is provided between the monocrystalline n-type $Al_xGa_{1-x}N$ ($0.7 \leq X \leq 1.0$) and the electrode.

The group III nitride laminate of the present invention may preferably employ the following aspects.

1) The n-type contact layer contains at least one n-type dopant selected from Si and Sn, and the n-type dopant concentration is $10^{18}$ to $10^{21}$ is $cm^{-3}$.

2) The n-type contact layer is a single crystal or polycrystal.

3) The monocrystal line n-type $Al_xGa_{1-x}N$ ($0.7 \leq X \leq 1.0$) is an n-type AlN.

4) The surface of the monocrystalline n-type $Al_xGa_{1-x}N$ ($0.7 \leq X \leq 1.0$) on which the electrode is formed is a nitrogen polar face.

Furthermore, a second aspect of the present invention is a vertical semiconductor device including the above-described group III nitride laminate.

Advantageous Effects of the Invention

The present invention allows a reduction in a resistance between the monocrystalline n-type $Al_xGa_{1-x}N$ ($0.7 \leq X \leq 1.0$) having the high Al composition and the electrode. As a result, for example, it becomes possible to reduce an operation voltage of a light-emitting element in a vertical semiconductor device, such as a 230 nm or less ultraviolet light-emitting element, having the group III nitride laminate according to the present invention. Furthermore, in the case of application to an ultraviolet light-emitting element using an n-type AlN substrate, forming the group III nitride laminate according to the present invention on an opposite side to a surface having a light-emitting element layer of the n-type AlN substrate allows production of the vertical ultraviolet light-emitting element having a low operation voltage.

DESCRIPTION OF THE EMBODIMENTS

Figure 1:
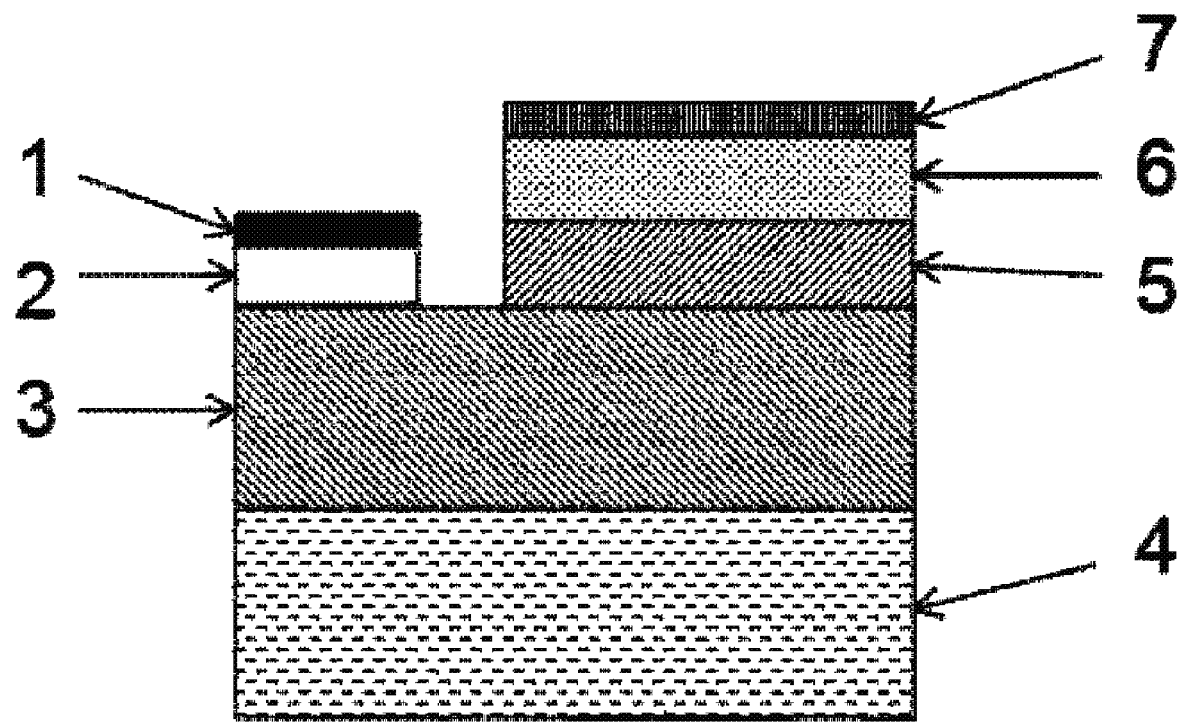
FIG. 1 is a schematic cross-sectional view illustrating an example of a vertical semiconductor device including a group III nitride laminate of the present invention.

The group III nitride laminate of the present invention is a laminate having monocrystalline n-type $Al_xGa_{1-x}N$ ($0.7 \leq X \leq 1.0$) and an electrode, and is characterized in that an n-type contact layer made of $(Al_yGa_{1-y})_2O_3$ ($0.0 \leq Y < 0.3$) is provided between the monocrystalline n-type $Al_xGa_{1-x}N$ ($0.7 \leq X \leq 1.0$) and the electrode. As long as the group III nitride laminate has the above-described structure, the shape thereof is net particularly limited. The monocrystalline n-type $Al_xGa_{1-x}N$ itself may be a substrate, or a monocrystalline n-type $Al_xGa_{1-x}N$ layer may be formed oft a substrate to be a laminated structure as a whole. In the case of the laminated structure having the monocrystalline n-type $Al_xGa_{1-x}N$ layer formed therein, the monocrystalline n-type $Al_xGa_{1-x}N$ layer may be directly formed on the substrate, or a buffer layer or the like way be inserted between the substrate and the monocrystalline n-type $Al_xGa_{1-x}N$ layer to be a multilayer structure as a whole. Each layer of the group III nitride laminate according to the present invention will be described below.

(Monocrystalline n-Type $Al_xGa_{1-x}N$ ($0.7 \leq X \leq 1.0$))

The monocrystalline n-type $Al_xGa_{1-x}N$ ($0.7 \leq X \leq 1.0$) in the present invention is a monocrystalline n-type semiconductor.

The thickness of the monocrystalline n-type $Al_xGa_{1-x}N$ is not particularly limited when a laminated structure in which a monocrystalline n-type $Al_xGa_{1-x}N$ layer is formed is adopted, and is usually in a range of 0.1 to 10 μm. As a substrate material to be used, a known monocrystalline substrate material such as sapphire. Sic, or AlN can be used. However, AlN having a small difference in a lattice constant from the n-type $Al_xGa_{1-x}N$ layer is preferably used for the purpose of preventing formation of a crystal defect (dislocation) in the monocrystalline n-type $Al_xGa_{1-x}N$ layer.

The Al composition (X) in the monocrystalline n-type $Al_xGa_{1-x}N$ ($0.7 \leq X \leq 1.0$) layer is not particularly limited, and may fee appropriately determined depending on the design within the scope of the present invention. The group III nitride laminate according to the present invention can provide enhanced effects when the aforementioned Al composition is in the high range. Although the Al composition (X) is equal to or lower than the lower limit value of the present invention, favorable contact characteristics can be obtained using the structure of the present invention. However, when X<0.7, favorable electrode characteristics can be easily obtained by the method disclosed, for example, in Patent Literature 1. Thus, it is difficult to obtain the effects due to the formation of the n-type contact layer according to the present invention, and also there is a disadvantage in which the electrode formation process is complicated.

In the case of a monocrystalline substrate made of monocrystalline n-type $Al_xGa_{1-x}N$, an Al composition (X) is not particularly limited, but AlN (X=1) is preferably used from the viewpoints of productivity, non-occurrence of composition unevenness in the substrate, and the like. The thickness of the substrate is not particularly limited and can be appropriately determined according to a desired application and design. However, the thickness is preferably 20 to 1000 μm in consideration of self-standing properties as the substrate.

The dislocation density of the monocrystalline n-type $Al_xGa_{1-x}N$ layer, or the n-type $Al_xGa_{1-x}N$ substrate is not particularly limited, but is preferably $10^8$ cm$^{-2}$ or less, and is more preferably $10^6$ cm$^{-2}$ or less, and is most preferably $10^4$ cm$^{-2}$ or less, in order to prevent deterioration in the characteristics and reliability of a semiconductor device having the group III nitride laminate according to the present invention. The preferable lower limit value of the dislocation density is 0 cm$^{-2}$, but is $10^2$ cm$^{-2}$ in consideration of limitations in analytical precision and industrial product quality. The dislocation density may be measured by observation using a transmission electron microscope (TEM), or, in a simplified manner, by observation of an etch pit density after being immersed in an alkaline solution.

The monocrystalline n-type $Al_xGa_{1-x}N$ ($0.7 \leq X \leq 1.0$) according to the present invention is an n-type semiconductor containing an n-type dopant an $Al_xGa_{1-x}N$ ($0.7 \leq X \leq 1.0$). As the n-type dopants, a known n-type dopant such as Si, Ge, and O may be used without any limitation, and Si having a small ionization energy in $Al_xGa_{1-x}N$ ($0.7 \leq X \leq 1.0$) is preferably used. The concentration of the n-type dopant is not particularly limited and may be appropriately determined according to the purpose. In the case where the n-type dopant concentration is $1 \times 10^{18}$ cm$^{-3}$ or less, the n-type conductivity decreases, so that the resistance at the interface tends to increase. On the other hand, in the case where the n-type dopant concentration is $5 \times 10^{19}$ cm$^{-3}$ or more, the n-type conductivity tends to decrease due to the inclusion of defects and impurities which compensate for the n-type dopant. Accordingly, in order ho reduce the resistance value between the electrode and the n-type contact layer, the n-type dopant concentration is preferably $1 \times 10^{18}$ to $1 \times 10^{20}$ cm$^{-3}$, acid more preferably $5 \times 10^{18}$ to $5 \times 10^{19}$ cm$^{-3}$.

The monocrystalline n-type $Al_xGa_{1-x}N$ may be formed of a plurality of layers having different n-type dopant concentrations within the above-described range and having different concentrations in the film thickness direction. Measurement of the n-type dopant concentration may be performed by a known technique ouch as a secondary ion mass spectrometry (SIMS). Further, the n-type conductivity nay be measured by known Hall effect measurement, CV measurement, or the like.

The plane direction of a surface of the monocrystalline n-type $Al_xGa_{1-x}N$ layer or the n-type $Al_xGa_{1-x}N$ substrate, on which the n-type contact layer and the electrodes are formed, may be appropriately determined in accordance with design. In general, a semiconductor device made of a group III nitride has such a structure that crystal is laminated so as to expose a C face at a substrate. In this case, the plans direction of the surface of the n-type $Al_xGa_{1-x}N$, on which the n-type contact layer and the electrodes are formed, is a C face (group III polar face) or –C face (nitrogen polar face). In the case of a flip-chip structure in which electrodes are formed on the same side as a semiconductor device layer, the piano direction of the n-typo $Al_xGa_{1-x}N$ is the C face (croup III polar face). In the case of using the monocrystalline n-type $Al_xGa_{1-x}N$ substrate, the n-type contact layer and the electrodes are formed on the –C face (nitrogen polar surface), thus allowing producing a vertical semiconductor device.

The monocrystalline n-type $Al_xGa_{1-x}N$ according to the present invention may be produced by a known monocrystalline growth method, soon as a metal organic chemical vapor deposition (MOCVD) method, a molecular beam epitaxy (MBE) method, a hydride vapor phase epitaxy (BVPE) method, a sublimation method, or a physical vapor transportation (PVT) method. A proper, method of these crystalline growth methods may be appropriately selected in accordance with a desired thickness and shape. In the case of forming the monocrystalline n-type $Al_xGa_{1-x}N$ layer on the substrate, the MOCVD method or the MBE method, which is suited for obtaining thin single crystal with high quality, is preferably used, and the MOCVD method having superior productivity is most preferable. On the other hand, in the case of producing the n-type monocrystalline $Al_xGa_{1-x}N$ substrate, the hydride vapor phase epitaxy (HVPE) method, the sublimation method, or the physical vapor transportation (PVT) method is preferably used, and the HVPE method, which has favorable controllability of an n-type dopant concentration in the monocrystalline n-type $Al_xGa_{1-x}N$ substrate, is most preferable.

(N-Type Contact Layer)

The n type contact layer according to the present invention is a layer made of $(Al_yGa_{1-y})_2O_3$ ($0.0 \leq Y < 0-3$) that is directly formed on the n-type $Al_xGa_{1-x}N$ ($0.7 \leq X \leq 1.0$). It is generally known that oxide semiconductors, such as ZnO and $Ga_2O_3$ (corresponding to an n-type contact layer at Y=0 in the retype contact layer according to the present invention), have low n-typo conductivity owing to oxygen defects formed in semiconductor layers, and the n-type conductivity is improved by doping donor impurities. The n-type contact layer, according to the present invention preferably contains at least one type of the n-typo dopant selected from Si and Sn as a donor impurity in a range of $10^{18}$ to $10^{21}$ $cm^{-3}$ in the n-contact layer, and more preferably $10^{19}$ to $5 \times 10^{20}$ $cm^{-3}$. The impurity concentration in the n-type contact layer may be measured by a known technique such as SIMS similar to the n-type $Al_xGa_{1-x}N$ ($0.7 \leq X \leq 1.0$).

The Al composition (Y) of the n-type contact layer is not particularly limited, and may be appropriately determined in accordance with design, within the scope as defined by the present invention. When the Al composition (Y) of the n-type contact layer is 0, in other words, when the n-type contact layer is made of $Ga_2O_3$, a band gap is minimized, i.e. on the order of 4.8 eV, and, in principle, the conductivity becomes the highest and therefore allows easily obtaining favorable contact characteristics with the electrodes. Since the band gap increases with an increase in the Al composition, a resistance value of the contact layer increases therewith, and, as a result, the contact characteristics with the electrodes tend to deteriorate. In other words, when attention is focused only on the contact characteristics with the electrodes, the n-type contact layer having a low Al composition is preferably used.

On the other hand, when attention is paid to the light transparency of the n-type contact layer, the band gap increases with the increase in the Al composition, so that it becomes transparent even for light of a shorter wavelength. As a result, there is an advantage that the degree of freedom of design can be improved, for example, when the group III nitride laminate according to the present invention is applied to, for example, an ultraviolet light-emitting diode, it can be used as a transparent contact layer. As described above, the band gap of $Ga_2O_3$ is about 4.8 eV, which absorbs light having a wavelength of about 260 nm or less, while it can transmit light of a shorter wavelength as the Al composition increases. For example, when the Al composition IV) is 0.2, the band gap is about 5.5 eV, and the transparency can be maintained up to 230 nm.

As described above, the Al composition of the n-type contact layer has a tradeoff relationship between conductivity and ultraviolet light transparency, but, in consideration of the practical light emission wavelength of a light-emitting element, the Al composition (Y) is preferably $0 \leq Y < 0.25$, and more preferably $0 \leq Y < 0.2$.

For the purpose of increasing the conductivity, the n-type contact layer according to the present invention is preferably crystalline, in other words, a single crystal or polycrystal. The crystalline n-type contact layer prevents the scattering of electrons in the n-type contact layer, and results in high conductivity. It is known that $Ga_2O_3$ and $Al_2O_3$ can have a plurality of crystalline structures, e.g., alpha, beta, gamma, delta, epsilon, and the like, but the crystalline structures are not particularly limited. As long as the effects of the present invention can be obtained, the n-type contact layer may be a layer having a single crystalline structure, or may be a layer having a plurality of crystalline structures. When the stability of the n-type contact layer is considered, the n-type contact layer preferably has a beta layer having a stable structure as a primary layer, and is most preferably composed only of the beta layer.

The film thickness of the n-type contact layer is not particularly limited, but it is preferably in the range of 5 to 1000 nm. Generally, as the contact layer thickness in direct contact with the electrode becomes thinner, the light transparency of the contact layer is improved while the electrode characteristics tend to deteriorate. On the other hand, from the viewpoint of the aforementioned light transparency and productivity, it is preferable to set the thickness of the contact layer to 1000 nm or less.

The n-type contact layer of the present invention may be formed by a known deposition method such as an MOCVD method, an MBE method, an HVPE method, a mist CVD method, a pulse laser deposition (PLD) met hoc, a sputtering method, etc., capable of forming a crystalline oxide film. In the case of using the MOCVD method, the MBE method, or the HVPE method, Ga and Al raw materials and an oxygen source are supplied onto the n-type $Al_xGa_{1-x}N$ together with a carrier gas to grow the n-type contact layer. As specific growth conditions, the conditions described, for example, in J. Electronic Materials, vol. 44, p. 1357-1360 (MOCVD method), J. Crystal Growth, Vol. 378, p. 591-595 (MBE method), Japanese J. Appl. Phyis., Vol. 47, p. 7311-7313

(mist CVD), and J. Crystal Growth, Vol. 405, p. 19-22 (HVPE method) may be referred to. Further, the PLD method may be performed such that a ceramic target material having the same composition as that of the n-type contact layer, that is, $(Al_yGa_{1-Y})_2O_3$ (0.0≤Y<0.3) is irradiated with laser, in a high vacuum environment to evaporate the ceramic target material, thereby depositing the n-type contact layer on the n-type $Al_xGa_{1-x}N$. In the sputtering method, similarly to the PLD method, gas ions are made to collide with a ceramic target material under vacuum, so that the n-type contact layer is deposited by the discharged ceramic target: material. As the PLD method and sputtering method, those described, for example, in Physica Status Solidi (a), Vol. 221, p. 34-39 (PLD method) and J. Optoelectronics and Advanced Materials Vol. 7, p. 391-896 (sputtering method) may be referred to. As a target used for the PLD method and sputtering method, a target material containing Sn and Si for coping may also be used.

(Electrode)

In the present invention, the electrode nay employ any known materials without any limitation as long as tae material can reduce the electrode resistance with the n-type contact layer. Examples thereof that can be used may include morals such as Au, Al, Ti, Sn, Ge, In, Ni, Co, Pt, W, Mo, Cr, Co, and Pb, alloys containing two or more of these metals, conductive compounds such as ITC, and those having a two-layer structure composed of two different metals (for example, Ti/Al, Ti/Au, Ti/Pt, Al/Au, Ni/Au, and Au/Ni) as described in Japanese Patent Application Laid-Open No. 2015-002293. Such an electrode may be formed by a known chin film forming technique such as a vacuum evaporation method, a sputtering method, or the like. For the purpose of reducing the electrode resistance with the n-type contact layer, it is preferable to perform annealing treatment on these electrodes after forming the electrodes. Although the atmosphere and temperature of the annealing treatment are not particularly limited, they may be set to about 500° C. in a nitrogen atmosphere, for example, as described in Japanese Patent Application Laid-Open No. 2015-002293.

A description will next be given or a vertical semiconductor device including the croup III nitride laminate according to the present invention.

(Vertical Semiconductor Device Including the Group III Nitride Laminated)

Figure 2:
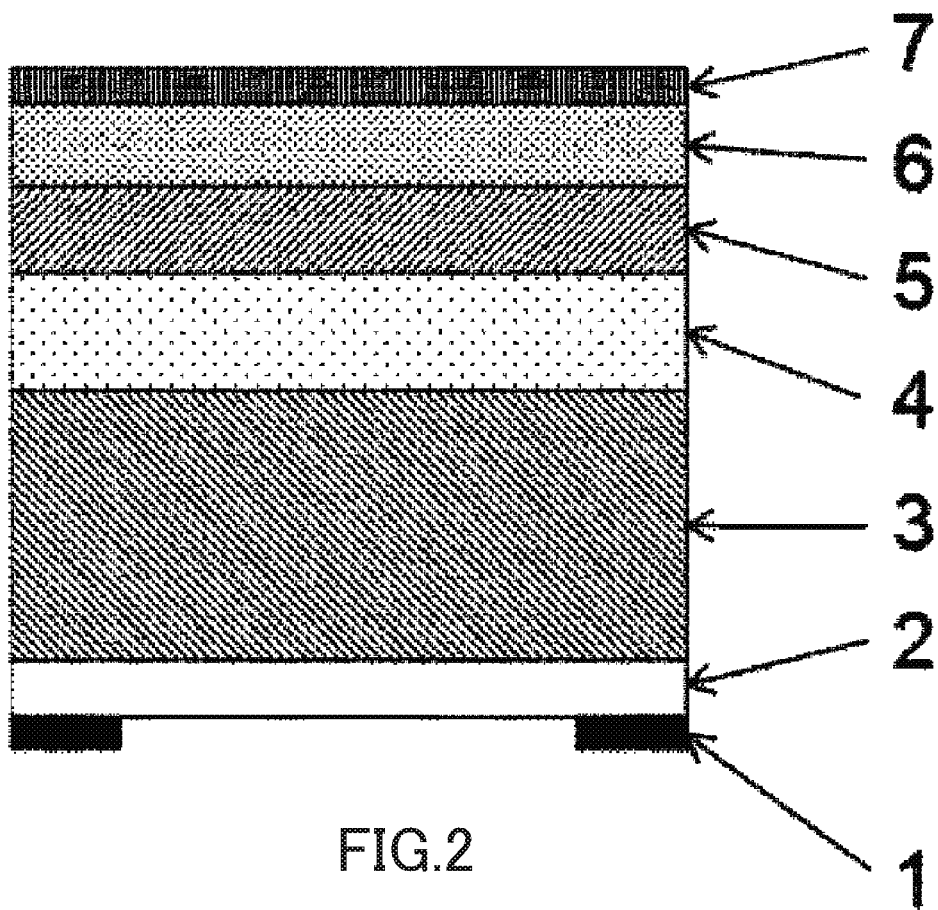
FIG. 2 is a schematic cross-sectional view illustrating another example of the vertical semiconductor device including the group III nitride laminate of the present invention.

Hereinafter, a description will be given of a vertical semiconductor device including the group III nitride laminate according to the present invention by referring to the drawings. FIG. 1 is a schematic cross-sectional view of a flip-chip type light-emitting diode including the group III nitride laminate according to the present invention. FIG. 2 is a schematic cross-sectional view illustrating the vertical light-emitting diode including the group III nitride laminate according to the present invention.

In the flip-chip type light-emitting diode illustrated in FIG. 1, an n-type $Al_xGa_{1-x}N$ layer 3 is formed on a substrate 4, and an n-type contact layer 2 and an electrode 1 are formed on a part of the surface of the n-type $Al_xGa_{1-x}N$ layer 3. In this case, the plane direction of the surface of the n-type $Al_xGa_{1-x}N$ layer 3 where the n-type contact layer 2 is formed is a C face (group III polar face). Further, an active layer 5, a p-type layer 6, and a p-electrode 7 are formed in this order in the region where the n-type contact layer is not formed on the surface of the n-type $Al_xGa_{1-x}N$ layer 3.

In producing the structure illustrated in FIG. 1, the n-type $Al_xGa_{1-x}N$ layer 3, the active layer 5, and the p-type layer 6 are first grown in this order on the substrate 4 by an MOCVD method or the like. A buffer, layer may be provided between the substrate 4 and the n-type $Al_xGa_{1-x}N$ layer 3 for the purpose of increasing the crystal quality of the n-type $Al_xGa_{1-x}N$ layer 3 or controlling the distortion. Next, a region where the n-type contact layer of the n-type $Al_xGa_{1-x}N$ layer 3 is to be formed is exposed by known photolithography and dry etching. After that, an n-type contact layer is formed at the exposed portion, and then the electrode 1 and tins p-electrode 7 are formed.

As to the vertical light-emitting diode illustrated in FIG. 2, after growing the n-type layer 4, the active layer 5, and the p-type layer 6 in this order on an n-type $Al_xGa_{1-x}N$ substrate 3, the n-type contact layer 2 is deposited on the rear face of the n-type $Al_xGa_{1-x}N$ substrate 3, i.e., the −C face (nitrogen polar face). After that, the electrodes 1 and the p electrode 7 are formed on the n-type contact layer 2 and the p-type layer 6, respectively. Although FIG. 2 illustrates an example in which the electrodes 1 are formed on parts of the n-type contact layer 2, the n-type contact layer 2 may be formed as parts of the n-type $Al_xGa_{1-x}N$ substrate 3 similarly to the electrodes 1.

Although the vertical semiconductor device according to the present invention has been described with reference to the drawings, the present invention is not limited to these and the present invention nay be applied to semiconductor devices with other structures including the group III nitride laminate according to the present invention without departing from the scope of the present invention.

EXAMPLE

A detailed description will be given of the present invention by way of Examples and Comparative Examples, out toe present invention is not limited to these Examples.

Example 1

A C-face AlN monocrystalline substrate of ϕ$23 mm, produced by a PVT method, was prepared. The AlN seed substrate had an off angle of 0.05° to 0.5°, and a dislocation density of $10^4$ $cm^{-2}$ or less.

Next, the AlN substrate was put on a susceptor in an MOCVD apparatus. The AlN substrate was heated to 1200° C., while a mixture gas of hydrogen and nitrogen flowed at a total, flow rate of 13 slm, so that a crystal growth surface was cleaned. Next, a substrate temperature was raised to 1050° C., and an n-type $Al_{0.8}Ga_{0.1}N$ layer (n-type $Al_xGa_{1-x}N$ layer) of 1.0 μm was formed under the conditions of a trimethylaluminum flow rate of 35 μmol/min, a trimethylgallium flow rate of 35 μmol/min, a tetraethylsilane flow rate of 0.03 μmol/min, and an ammonia flow rate of 1.5 slm. The substrate after the growth was out into a plurality of squares of 7×7 mm.

SIMS analysis was conducted on one of the cut substrates using cesium ions so primary ions, to perform an Si concentration quantitative evaluation. The Si concentration in the n-type $Al_{0.9}Ga_{0.1}N$ layer was $1 \times 10^{19}$ $cm^{-3}$. Furthermore, after the same substrate was immersed for 5 minutes in a mixture solution of potassium hydroxide and sodium hydroxide heated to 450° C., arbitrary 10 fields were observed at the field of view of 100 μm square by a differential interference microscope, to observe an etch pit density (dislocation density). The calculated etch pit density (dislocation density) way $8 \times 10^4$ $cm^{-2}$. As to another substrate, Ti (20 nm)/Al (100 nm)/Ti. (20 nm)/Au (50 nm) were formed at four corners of the substrate of 7×7 mm on the n-type $Al_{0.8}Ga_{0.1}N$ layer, toy a vacuum evaporation method, and a heat treatment was applied thereto under the conditions of 1000° C. in a nitrogen atmosphere. As a result of measurement of the Hall effect of the substrate, the concentration of electrons was $2 \times 10^{17}$ cm$^{-3}$ and a specific resistance was 0.9 Ωcm at room temperature.

Next, the out two substrates were put on a susceptor of an HVPE apparatus. A gallium chloride gas (a feed partial pressure of $1 \times 10^{-3}$ atm), which was obtained by reaction of metal Ga heated to 850° C. and a chlorine gas, oxygen (a feed partial pressure of $5 \times 10^{-3}$ atm), and a silicon tetrachloride gas (a feed partial pressure of $1 \times 10^{-6}$ atm) were supplied over the substrata heated to 1000° C., together with a nitrogen carrier gas, to form $Ga_2O_3$ (n-type contact layer) in which Si was doped on the n-type $Al_{0.9}Ga_{0.3}N$ layer. XRDω-2θ was measured on one of the substrates in which the n-type contact layers were formed. As a result, it was confirmed chat the n-type contact layer was a beta-type $Ga_2O_3$ monocrystalline layer oriented in a (−201) face. Furthermore, as a result of SIMS analysis on the same substrate, the Si concentration in the n-type contact layer was $2 \times 10^{18}$ cm$^{-3}$.

Next, a plurality of Ti (20 nm)/Au (200 nm) (electrodes) of 300×300 μm were formed on the n-type contact layer by a vacuum evaporation method, and a heat treatment was applied thereto under the conditions of 500° C. in a nitrogen atmosphere. After that, portions of the n-type contact layer, except for portions of the electrodes formed thereon, were etched by an ICP etching apparatus until the n-type $Al_{0.9}Ga_{0.1}N$ layer was exposed.

A current-voltage measurement was performed between the electrodes in the range of a measurement voltage of −20 to 20 V in order to estimate a Schottky barrier between the electrode and the n-type contact layer. The Schottky barrier, was estimated to be 0.1 v or less.

Example 2

An n-contact layer and electrodes were formed in the same process as that in Example 1 except that the flow rate of trimethylgallium was changed to 11 μmol/min and an n-type $Al_{0.8}Ga_{0.2}N$ layer (n-type $Al_xGa_{1-x}N$ layer) of 1.0 μm was formed. The Si concentration and etch pit density in the n-type $Al_{0.8}Ga_{0.2}N$ layer were the same as those in Example 1. The concentration of elections and specific resistance of the n-type $Al_{0.8}Ga_{0.2}N$ layer were $2 \times 10^{18}$ cm$^{-3}$ and 0.07 Ωcm, respectively. The Schottky barrier estimated by performing a current-voltage measurement between the electrodes in the range of measurement voltage of −20 to 50 V was 0.1 V or less.

Example 3

Two of the substrates of 7×7 mm obtained in Example 1, on which the n-type $Al_{0.9}Ga_{0.1}N$ layer (n-type $Al_xGa_{1-x}N$ layer) was formed were put on the susceptor of the HVPE apparatus. A gallium chloride gas (a feed partial pressure of $9 \times 10^{-4}$ atm) which was obtained by reaction of metal Ga heated to 850° C. and a chlorine gas, an aluminum chloride gas (a feed partial pressure of $3 \times 10^{-8}$ atm), which was obtained by reaction of metal Al heated to 550° C. and a hydrogen chloride gas, oxygen (a feed partial pressure of $5 \times 10^{-3}$ atm), and a silicon tetrachloride gas (a feed partial pressure of $1 \times 10^{-6}$ atm) were supplied over the substrate heated to 1000° C., together with a nitrogen carrier gas, to form $(Al_yGa_{1-y})_2O_3$ (n-type contact layer) in which Si is doped on the n-type $Al_{0.8}Ga_{0.1}N$ layer. XRDω-2θ was measured on one of the substrates in which the n-type contact layer was formed. As a result, it was confirmed that the n-type contact layer was a beta-typo $(Al_{0.1}Ga_{0.9})_2O_3$ monocrystalline layer (Y=0.1) oriented in a (−201) face. Furthermore, as a result of SIMS analysis on the same substrate, the Si concentration in the n-type contact layer was $3 \times 10^{19}$ cm$^{-3}$.

Next, Ti (20 nm)/Au (200 nm) (electrodes) were formed in the same procedure as that in Example 1. After a heat treatment was applied thereto under, the conditions of 500° C. in a nitrogen atmosphere, portions of the n-type contact layer, except for portions of the electrodes formed thereon, were etched by an ICP etching apparatus. The Schottky carrier estimated by a current-voltage measurement was 0.4 V.

Example 4

A C-face AlN monocrystalline substrate that was produced by the same PVT method as that in Example 1 was prepared. The AlN substrate was put on the susceptor in the HVPE apparatus, and the pressure of the inside of the HVPE apparatus was set at 750 Torr. The seed substrate was heated to 1450° C. in an atmosphere of a mixture carrier gas of hydrogen and nitrogen. At this time, an ammonia gas was supplied so as to be at 0.5 volume % relative to a total carrier gas flow rate (10 slm). Next, an aluminum chloride gas, which was obtained by reaction of metal Al heated to 450° C. and a hydrogen chloride gas, was supplied so as to be at 0.05 volumes relative to the total carrier gas flow rate, so chat an n-type AlN layer of 330 μm was formed on the seed substrate. At this time, five quartz pieces (3 mm square× thickness of 1 mm) were put on the susceptor, and Si was doped into the AlN layer using a reaction and decomposition phenomenon of quartz occurring during growth.

After that, the portion of the AlN monocrystalline substrate produced by the PVT method was removed by mechanical polishing, to produce a self-standing substrate (n-type $Al_xGa_{1-x}N$ substrate) made of n-type AlN produced by the HVPE method. Next, the growth surface (Al polar face) and an N-polar face were smoothed by chemical mechanical polishing (CMP). The n-type AlN substrate obtained in this manner had a thickness of 200 μm. After that, the AlN substrate was cut into a plurality of 7×7 squares.

As a result, of conducting SIMS quantitative analysis on one of the cut substrates, an Si concentration was $3 \times 10^{18}$ cm$^{-3}$. Furthermore, the same substrate was immersed on the side of the Al polar face thereof: for 5 minutes in a mixture solution of potassium hydroxide and sodium hydroxide heated to 450° C., an etch pit density was observed, in the same manner as that m Example 1. The calculated etch pit density (dislocation density) was $2 \times 10^5$ cm$^{-2}$. As to another substrate, Ti (20 nm)/Al (100 nm)/Ti (20 nm)/Au (50 nm) were formed at four corners of the substrate of 7×7 mm on the C face ((group III polar face) by a vacuum evaporation method, and a heat treatment was applied thereto under the conditions of 1000° C. in a nitrogen atmosphere. As a result of measurement of the Hall effect of the substrate, the concentration of electrons $4 \times 10^{14}$ cm$^{-3}$ and a specific resistance was 95 Ωcm at room temperature.

Next, $Ga_2O_3$ (n-type contact layer) and Ti (20 nm)/Au (200 nm) (electrodes) were formed on the self-standing nitrogen polar face made of n-type AlN, and a heat treatment was applied thereto under the conditions of 500° C. in a nitrogen atmosphere. After that, portions of n-type contact layer, accept for portions of the electrodes formed thereon, were etched by an ICP etching apparatus. As a result of performing a current-voltage measurement between the electrodes in the range of a measurement voltage of −20 to 20 V, the height of the Schottky barrier was 0.3 V.

Comparative Example 1

As to one substrate of 7×7 mm cut in Example 1, a plurality of electrodes of 300×300 μm were formed on the n-type $Al_{0.3}Ga_{0.1}N$ layer in the same procedure as that for the sample for measurement of the Hall effect. A current-voltage measurement was performed between the electrodes in the range of a measurement voltage of −20 to 20 V, and as a result, the Schottky barrier, was 1.8 V.

Comparative Example 2

As to one substrate of: 7×7 mm cut in Example 2, a plurality of electrodes of 300×300 μm were formed on the n-type $Al_{0.8}Ga_{0.2}N$ layer in the same procedure as that for the sample for measurement of the Hall effect. A current-voltage measurement was performed between the electrodes in the range of a measurement voltage of −20 to 20 V, and as a result, the Schottky barrier was 0.15 V.

Comparative Example 3

An n-contact layer was formed on the n-type $Al_{0.9}Ga_{0.1}N$ layer in the same runner as that in Example 2 except, that the feed partial pressure of the aluminum chloride gas in Example 2 was changed to $1\times10^{-3}$ atm. XRDω-2θ was measured on one of the substrates in which the n-type contact layer was formed. As a result, it was confirmed that the n-type contact layer was a beta-type $(Al_{0.4}Ga_{0.6})_2O_3$ monocrystalline layer (Y=0.4) oriented in a (−201) face. Furthermore, as a result of SIMS analysis on the same substrate, the Si concentration of the n-type contact layer was $5\times10^{19}$ cm$^{-3}$.

Next, Ti (20 nm)/Au (200 nm) (electrode) was formed in the same manner as that in Example 1, and a heat treatment was applied thereto under the conditions of 500° C. in a nitrogen atmosphere. After that, portions of the n-type contact layer, except for portions of the electrodes-formed thereon, were etched by an TCP etching apparatus. A current-voltage measurement was performed and it was found that the resistance value was significantly large in the range of −20 to 20 V, and the Schottky barrier was 12 V.

Comparative Example 4

A plurality of electrodes of 300×300 μm were formed on the nitrogen polar face of the n-type AlN substrate obtained in Example A in the same procedure as that for the sample for measurement of the Hall effect of Example 1. A current-voltage measurement was performed between the electrodes in the range of a measurement voltage of −20 to 20 V, and as a result, the Schottky barrier was 8.2 V.

Comparative Example 5

Using one substrate of 7×7 non cut in Example 1, $Ga_2O_3$ (n-type contact layer) doped with Si was formed on the n-type $Al_{0.9}Ga_{0.1}N$ layer in the same manner as that in Example 1 except that, the feed partial pressure of the silicon tetrachloride gas was changed to $1\times10^{-8}$ atm. XRDω-2θ was measured on one of the substrates in which the n-type contact layer was formed. As a result of SIMS analysis, the Si concentration of the n-type contact layer was $9\times10^{16}$ cm$^{-3}$.

A plurality of electrodes of 300×300 μm were formed in the same manner as that m Example 1. A current-voltage measurement was performed between the electrodes in the range of a measurement voltage of −20 to 20 V, and as a result, the Schottky barrier was 1.3 V.

The invention claimed is:
1. A semiconductor device comprising a group III nitride laminate comprising monocrystalline n-type $Al_xGa_{1-x}N$ (0.7≤X≤1.0) and an electrode, wherein an n-type contact layer made of crystalline $(Al_YGa_{1-Y}N)_2O_3$ (0.0<Y≤0.2) is provided between the monocrystalline n-type $Al_xGa_{1-x}N$ (0.7≤X≤1.0) and the electrode, and wherein the n-type contact layer has transparency to light having a wavelength of 230 nm or more and less than 260 nm.
2. The semiconductor device according to claim 1, wherein the n-type contact layer contains at least one n-type dopant selected from Si and Sn, and a concentration of the n-type dopant is $10^{18}$ to $10^{21}$ cm$^{-3}$.
3. The semiconductor device according to claim 1, wherein the n-type contact layer is a single crystal layer or a polycrystal layer.
4. The semiconductor device according to claim 1, wherein the monocrystalline n-type $Al_xGa_{1-x}N$ (0.7≤X≤1.0) is an n-type AlN.
5. The semiconductor device according to claim 1, wherein a surface of the monocrystalline n-type $Al_xGa_{1-x}N$ (0.7≤X≤1.0) at which the electrode is provided is a nitrogen polar face.

* * * * *